United States Patent
Sasaki et al.

(10) Patent No.: US 6,348,362 B1
(45) Date of Patent: Feb. 19, 2002

(54) MANUFACTURING METHOD OF PHOTOVOLTAIC DEVICE

(75) Inventors: Manabu Sasaki, Osaka; Katsunobu Sayama; Eiji Maruyama, both of Katano, all of (JP)

(73) Assignee: Sanyo Electric Co., Ltd., Osaka-fu (JP)

( * ) Notice: Subject to any disclaimer, the term of this patent is extended or adjusted under 35 U.S.C. 154(b) by 0 days.

(21) Appl. No.: 09/722,718

(22) Filed: Nov. 28, 2000

(30) Foreign Application Priority Data

Nov. 29, 1999 (JP) .......................................... 11-336985

(51) Int. Cl.[7] .............................................. H01L 21/00
(52) U.S. Cl. .......................................... 438/98; 438/940
(58) Field of Search .......................... 438/152, 66, 96, 438/98, 940

(56) References Cited

U.S. PATENT DOCUMENTS

| | | | | |
|---|---|---|---|---|
| 4,772,335 A | * | 9/1988 | Huang | 136/258 |
| 5,217,921 A | * | 6/1993 | Kaido et al. | 437/173 |
| 5,800,632 A | * | 9/1998 | Arao et al. | 136/258 |
| 5,956,572 A | * | 9/1999 | Kidoguchi et al. | 438/96 |
| 5,976,396 A | | 11/1999 | McLean et al. | |
| 6,184,057 B1 | * | 2/2001 | Van Andel et al. | 438/66 |

FOREIGN PATENT DOCUMENTS

| | | |
|---|---|---|
| EP | 0 322 258 A2 | 6/1989 |
| EP | 0 324 550 A1 | 7/1989 |
| EP | 0 554 877 A1 | 8/1993 |
| EP | 0 827 212 A2 | 3/1998 |

* cited by examiner

Primary Examiner—Richard Elms
Assistant Examiner—Brad Smith
(74) Attorney, Agent, or Firm—Arent, Fox, Kintner, Plotkin & Kahn

(57) ABSTRACT

A manufacturing method of a photovoltaic device comprising a plurality of unit cells including a first electrode of zinc oxide, a photovoltaic conversion layer, and a second electrode on a surface of a substrate includes a process for forming a zinc oxide film on the surface of the substrate, a process for eliminating a predetermined part of the zinc oxide film by laser beam irradiation and dividing the zinc oxide film into a plurality of the first electrodes, and a process for etching the surface of the substrate including the plurality of the first electrodes.

11 Claims, 6 Drawing Sheets

MANUFACTURING METHOD OF PHOTOVOLTAIC DEVICE

BACKGROUND OF THE INVENTION

1. Field of the Invention

This invention relates to an integrated photovoltaic device, particularly relates to a manufacturing method of a photovoltaic device provided with a transparent electrode of zinc oxide.

2. Description of Prior Art

A photovoltaic device such as a solar cell can directly convert sunlight into electricity and has been commercialized as a new energy source. Such the photovoltaic device has been formed of crystalline semiconductor material such as single crystalline silicon and polycrystalline silicon, compound semiconductor material such as GaAs, InP or the like, and amorphous semiconductor material such as amorphous silicon and amorphous silicon germanium or the like. The photovoltaic device using the amorphous semiconductor material is manufactured at a low temperature as compared with other semiconductor material, can increase a size easily, and can easily be integrated on a substrate.

Figure 1:
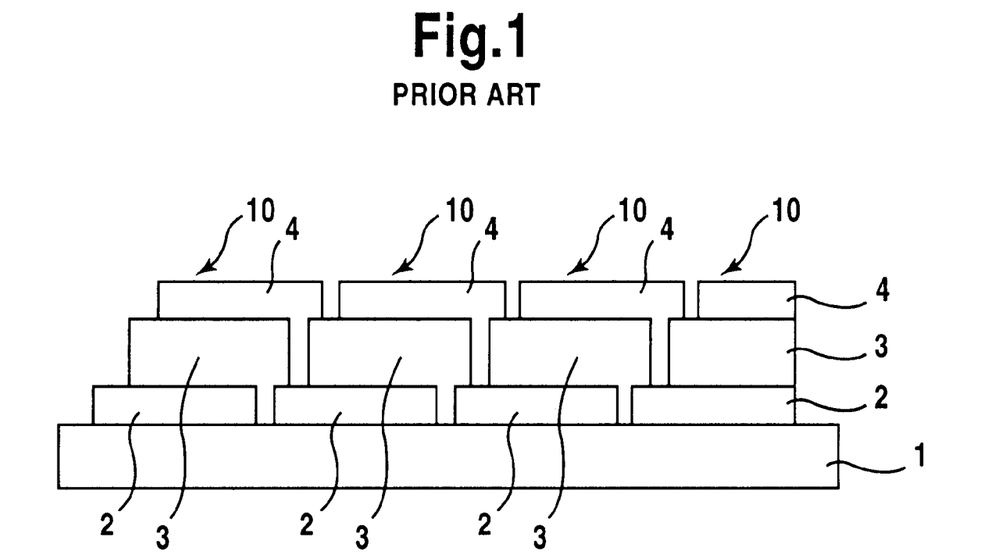
FIG. 1 is a structural cross sectional view of a photovoltaic device.

FIG. 1 is a structural cross sectional view of an integrated photovoltaic device using the amorphous semiconductor material.

Explanation is made on the integrated photovoltaic device by referring to FIG. 1.

A substrate 1 is formed of translucent and insulating material such as glass, plastic, or the like. A plurality of first electrodes 2 are arranged on a surface of the substrate 1. The first electrode 2 is formed of tin oxide ($SnO_2$) and has a rough plane for scattering light incident from the substrate 1 on the surface. This rough plane is generally referred as a texture plane.

A photovoltaic conversion layer 3 is formed of amorphous semiconductor material, and generally includes a p-type amorphous silicon carbide film of approximately 100 Å, an intrinsic amorphous silicon film of approximately 4000 Å, and an n-type amorphous silicon film of approximately 200 Å laminated in this order from a side of the first electrode 2. A second electrode 4 is formed of a highly reflective metal film such as Ag, Al or the like.

A lamination body of the first electrode 2, the photovoltaic conversion layer 3, and the second electrode 4 is a unit cell 10, and adjacent unit cells 10 are electrically connected in series by electrically linking the first electrode 2 of the one unit cell 10 and the second electrode 4 of the other unit cell 10.

FIGS. 2A–2E are structural cross sectional views of each of processes for illustrating manufacturing processes of the conventional photovoltaic device.

Figure 2A:
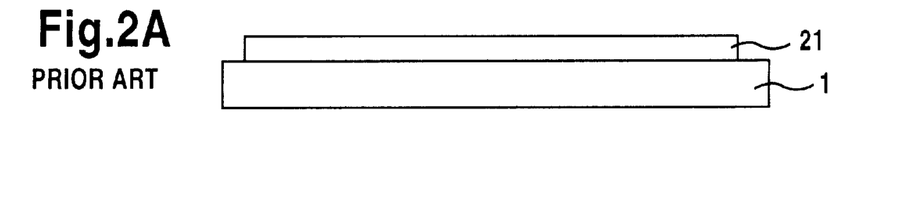
FIGS. 2A–2E are structural cross sectional views illustrating manufacturing processes of the photovoltaic device.
Figure 2B:
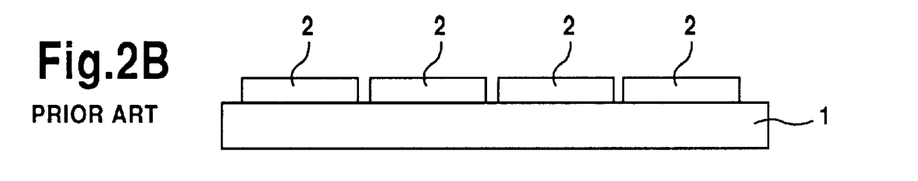

As shown in FIG. 2A, a transparent electrode film 21 of tin oxide ($SnO_2$) having a texture plane is formed on a surface of the substrate 1. A predetermined part of the transparent electrode film 21 is eliminated by laser beam irradiation and is divided into a plurality of the first electrodes 2, as shown in FIG. 2B.

Figure 2C:
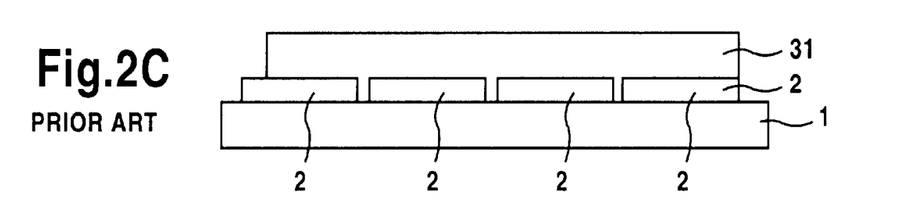

An amorphous semiconductor film 31 having pin junction inside is formed on the substrate so as to cover over the first electrodes 2 as shown in FIG. 2C.

Figure 2D:
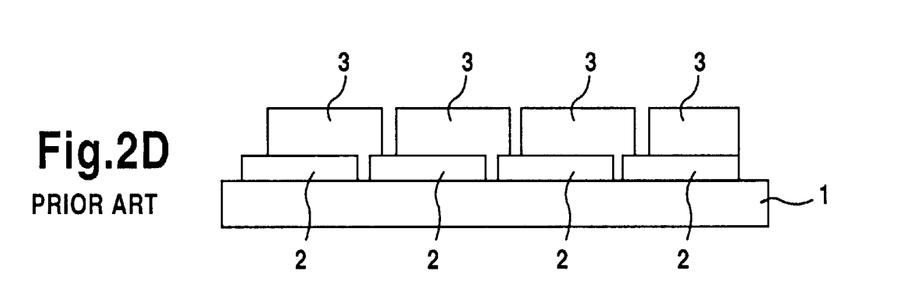

Then, a predetermined part of the amorphous semiconductor film 31 is eliminated by laser beam irradiation and is divided into a plurality of the photovoltaic conversion layers 3 as shown in FIG. 2D.

Figure 2E:
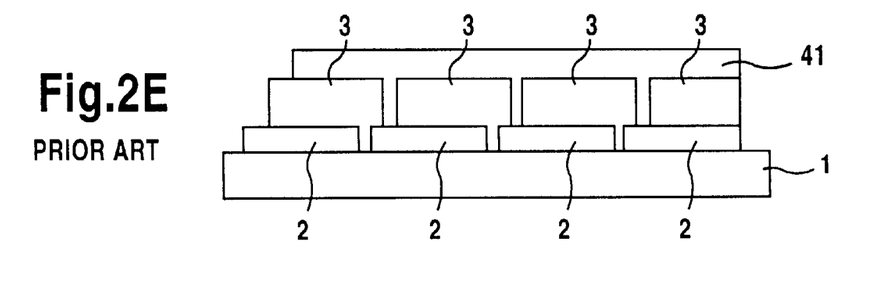

A metal film 4 is formed on the substrate 1 so as to cover the photovoltaic conversion layers 3 as shown in FIG. 2E. Then, a predetermined part of the metal film 41 is eliminated by laser beam irradiation and is divided into a plurality of the second electrodes 4 to produce the photovoltaic device as shown in FIG. 1.

The material for forming the first electrode as the transparent electrode is conventionally $SnO_2$. However, formation of $SnO_2$ requires a temperature higher than approximately 500° C., resulting in an increase in manufacture cost. And a substrate of less heat resistance such as plastic can not be usable and selection of substrate material is limited.

In conjunction with this, zinc oxide as material for the first electrode has been considered. The first electrode of zinc oxide can be prepared at a low temperature of not higher than 200° C. by sputtering, resulting in reduction of manufacture cost. In addition, selection of the substrate material is not limited as tightly as in the conventional case.

SUMMARY OF THE INVENTION

The applicants of this invention have examined and found that it is more difficult to electrically separate the adjacent first electrodes of zinc oxide in eliminating the predetermined part of the zinc oxide film by laser beam irradiation and dividing into a plurality of the first electrodes as compared with the first electrode of a $SnO_2$ film. Thus, leak current is likely to occur between adjacent unit cells of the photovoltaic device comprising the first electrodes of zinc oxide and the photovoltaic conversion characteristics are degraded.

A cause of the above problem has been examined. An expected cause of the problem is explained by referring to schematic cross sectional views of FIGS. 3A–3B. Elements having the same functions as in FIG. 1 have the same reference numerals.

Figure 3A:
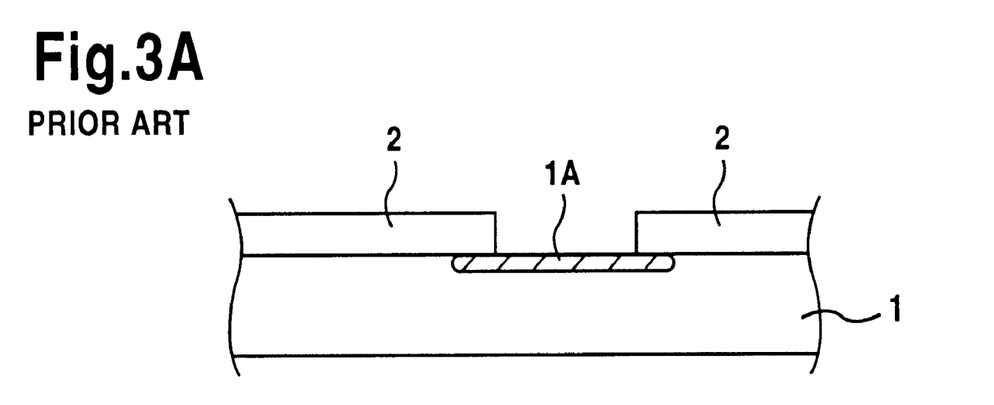
FIGS. 3A–3B are schematic cross sectional views illustrating causes of conventional problems.

When laser beam intensity for irradiating to the zinc oxide film is great, the temperature of the zinc oxide film increases and doping material of Al, Mg, Ga or the like for reducing a resistance value included in the zinc oxide film is scattered in the substrate 1 to form the diffusion region 1A on a surface of the substrate as shown in FIG. 3A. And leak current is generated between the adjacent first electrodes 2, 2 through the diffusion region 1A.

Figure 3B:
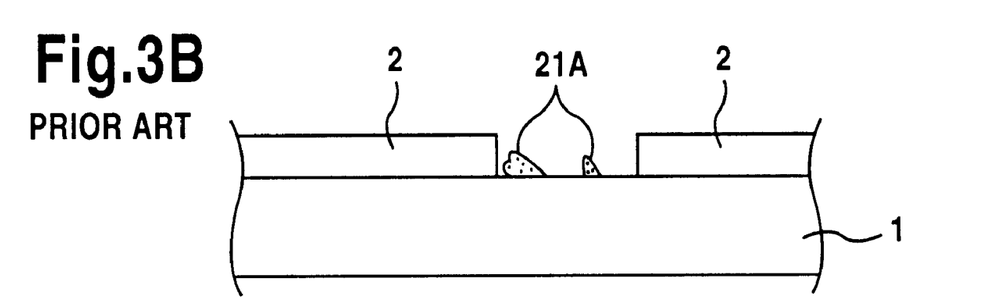

On the other hand, when laser beam intensity is small so as to suppress formation of the diffusion region 1A, the residual 21A of the zinc oxide film 21 is generated as shown in FIG. 3B and leak current occurs between the adjacent first electrodes 2 through the residual 21A.

When the first electrode is formed of zinc oxide and intensity of laser beams to be irradiated is great, doping material of Al, Mg, Ga or the like included in the zinc oxide is scattered and the diffusion region is formed on a surface of the substrate. When the intensity of the laser beams is small, residual of zinc oxide is generated. In these cases, it is expected that leak current occurs between the adjacent first electrodes through the diffusion region and the residual, and photovoltaic conversion characteristic are degraded.

In recent years, a thin film semiconductor device using a glass substrate has become large. A solar cell device which is used in the outside is particularly required to have mechanical strength. In conjunction with this, only attachment of a reinforced glass which requires complicated processes and is difficult to reduce production cost, and a reinforcement process, as a post-process, of a glass substrate with a transparent electrode which is difficult to have sufficient strength and film characteristics have been considered. In this case, when a temperature of the reinforced glass increases higher than 500° C. of a glass melting point after the reinforcement process, an effect of reinforcement and, as a result, the strength may be degraded. Although a $SnO_2$ film is commonly used material, this film can have sufficient characteristics only when formed at higher than 500° C. Therefore, the reinforced glass can not be used as a substrate. Thus, a method for reinforcing a glass substrate after mounting a transparent electrode has been examined.

In processing the transparent electrode by energy beams, the energy beams should be applied so that the temperature increases momentarily up to approximately 2000° C. of a melting point. Therefore, heat from irradiation energy transmits to a side of the glass when the energy beams are irradiated in order to divide the transparent electrode into a plurality of regions even though the transparent electrode of good characteristics are formed at lower than 500° C. As a result, the temperature increases up to higher than 500° C. locally, which causes fine cracks and irregular degradation of strength of the part of the glass to degrade the strength of the entire glass.

This invention was made to solve the existing problem and provides a manufacturing method of a photovoltaic device comprising a first electrode of zinc oxide capable of improving photovoltaic conversion characteristics.

This invention provides a manufacturing method capable of using reinforced glass as a substrate, improving photovoltaic conversion characteristic, and having sufficient mechanical strength.

A manufacturing method of a photovoltaic device provided with a plurality of unit cells including a first electrode of zinc oxide, a photovoltaic conversion layer, and a second electrode on a surface of a transparent substrate, comprises a process for forming a zinc oxide film on a surface of a substrate, a process for eliminating a predetermined part of the zinc oxide film by energy beam irradiation and dividing the zinc oxide film into a plurality of the first electrodes, and a process for etching the surface of the substrate provided with the plurality of the first electrodes.

A texture plane is formed on a surface of the first electrode by etching.

In this invention, a predetermined part of the zinc oxide film is eliminated by energy beam irradiation and the zinc oxide film is divided into a plurality of the first electrodes. Then, a diffusion region and residual of zinc oxide formed on a surface of the substrate are eliminated by etching. Leak current between the adjacent first electrodes decreases greatly as compared with the conventional case. Therefore, a photovoltaic device with excellent photovoltaic conversion characteristics can be provided by this invention.

A manufacturing method of a photovoltaic device provided with a plurality of unit cells including a first electrode of zinc oxide, a photovoltaic conversion layer, and a second electrode on a surface of a transparent substrate, comprising a process for forming a zinc oxide film on a surface of a substrate, a process for eliminating a predetermined part of the zinc oxide film by energy beam irradiation so as to leave the zinc oxide film of not less than a predetermined thickness on a side of the transparent substrate and preliminarily dividing the zinc oxide film into a plurality of the first electrodes, and a process for etching the surface of the substrate provided with the plurality of the first electrodes which are preliminarily divided, and electrically separating adjacent divided areas.

The transparent substrate is a reinforced glass.

In this invention, the transparent electrode of more than a predetermined thickness is intentionally remained on a glass substrate side of the transparent electrode in a process for dividing into a plurality of regions by energy beams, and the adjacent divided regions are electrically separated in the etching process. Degradation of substrate strength caused by fine cracks and irregular degradation of strength caused by heat transmitted to the glass in processing the transparent electrodes by energy beams is prevented with these processes.

In addition, development of over-etching is prevented in a readily etched part between the substrate and the transparent electrodes when attachment of scattered material generated in processing the transparent electrodes by energy beam prevents complete separation of the transparent electrodes. Thus, peeling of a transparent conductive film in proximity of a processed part is prevented and reliability and performance of a device are improved.

The above second constitution prevents an increase of a temperature to a melting point of glass and maintains an effect of reinforcement, thus is particularly effective in using reinforced glass.

DESCRIPTION OF PREFERRED EMBODIMENTS

Explanation is made on a manufacturing method of a photovoltaic device according to embodiments of the present invention provided in connection with the above view. Most of processes in this manufacturing method according to the embodiments are the same as the conventional processes, and features of this invention are explained by referring to FIGS. 2A–2E explained previously and FIGS. 4A–4D for illustrating the features of this invention.

As shown in FIG. 2A, a zinc oxide film 21 is formed on a substrate 1 by sputtering.

Then, a predetermined part of the zinc oxide film 21 is eliminated by laser beam irradiation and is divided into a plurality of the first electrodes 2. At this stage, a diffusion region 1A on the substrate 1 and residual 21A of the zinc oxide film seem to be generated, as shown in FIGS. 3A–3B.

The surface of the substrate 1 provided with a plurality of the divided first electrodes 2 is etched. By this etching, the residual 21A of zinc oxide and the diffusion region 1A are eliminated. The etching may be dry etching or wet etching;

any of methods capable of eliminating the diffusion region 1A on the substrate 1 and the residual 21A of zinc oxide. To eliminate them, selection of etching gas or etching solvent is important. It is required to select etching gas or etching solvent capable of etching component of the substrate 1 and zinc oxide. For example, chlorine solvent and acetic acid solvent are preferred for wet etching, but any one capable of etching component of the substrate 1 and zinc oxide can be used.

Then, as shown in FIG. 2C, a p-type amorphous silicon carbide film of approximately 100 Å, an intrinsic amorphous silicon film of approximately 4000 Å, and an n-type amorphous silicon film of approximately 200 Å are laminated in this order on the substrate 1 so as to cover the etched first electrodes 2 to form an amorphous semiconductor film 31.

As shown in FIG. 2D, a predetermined part of the amorphous semiconductor film 31 is eliminated by laser beam irradiation and is divided into a plurality of photovoltaic conversion layers 3.

As shown in FIG. 2E, a metal film 41 of silver is formed on the substrate 1 so as to cover the photovoltaic conversion layers 3 by sputtering. Then, a predetermined part of the metal film 41 is eliminated by laser beam irradiation and is divided into a plurality of the second electrodes 4 to manufacture an integrated photovoltaic device.

By the etching after eliminating the zinc oxide film by laser beam irradiation, the diffusion region 1A on the substrate 1 and the residual 21A of zinc oxide are eliminated. Therefore, leak current between the adjacent first electrodes is greatly reduced as compared with the conventional case, and a photovoltaic device having excellent photovoltaic characteristics is produced in this invention.

Followings are detailed explanation on a first embodiment of this invention by referring to FIGS. 4A–4D.

Figure 4A:
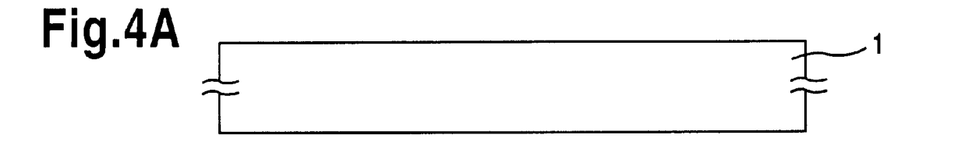
FIGS. 4A–D are structural cross sectional views of each of processes illustrating main parts of the manufacturing processes of a photovoltaic device according to a first embodiment of this invention.

In the first embodiment, as shown in FIG. 4A, a glass substrate is prepared as the substrate 1. A size of the substrate is 30×40 cm and 5 mm in thickness.

Figure 4B:
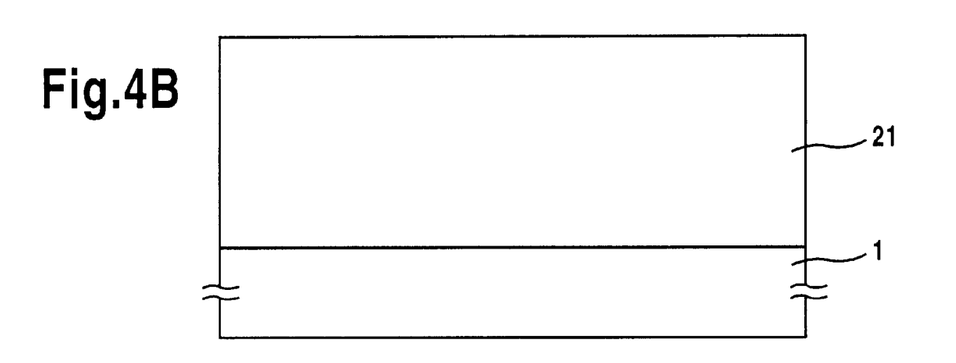

As shown in FIG. 4B, the zinc oxide film 21 of approximately 1 μm is formed on an approximately entire surface of the substrate 1 by sputtering. Conditions for forming the zinc oxide film is shown in Table 1.

TABLE 1

| Target | ZnO ($Al_2O_3$ dope: 2 wt %) |
|---|---|
| Applied RF power | 400 W |
| Pressure | 13.33 Pa |
| Sputtering gas | Ar: 20 SCCM |
| Substrate temperature | 170° C. |

Figure 4C:
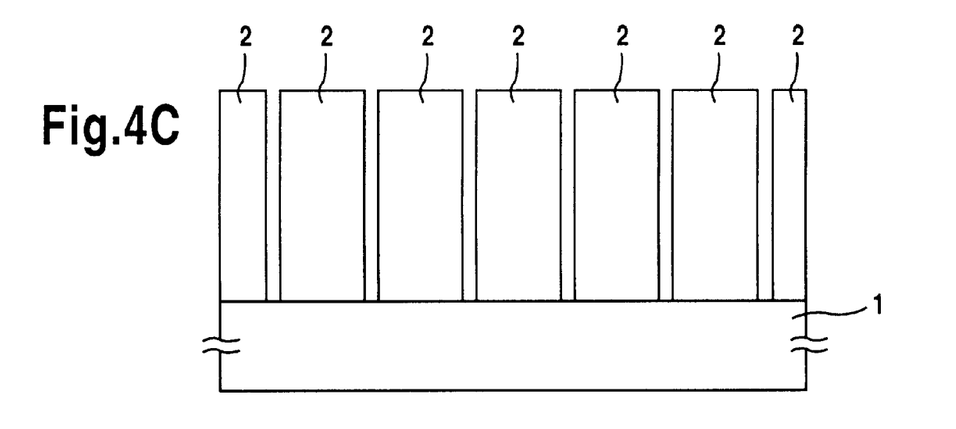

As shown in FIG. 4C, a predetermined part of the zinc oxide film 21 is eliminated by irradiation of YAG laser beam of wavelength 1.06 μm, pulse frequency 3 kHz, and intensity $4.0 \times 10^7$ W/cm$^2$, and is divided into a plurality of the first electrodes 2. The zinc oxide film 21 is not completely eliminated by the YAG laser beam irradiation under these conditions, and the residual 21A of the zinc oxide film is found on the surface of the substrate 1.

Figure 4D:
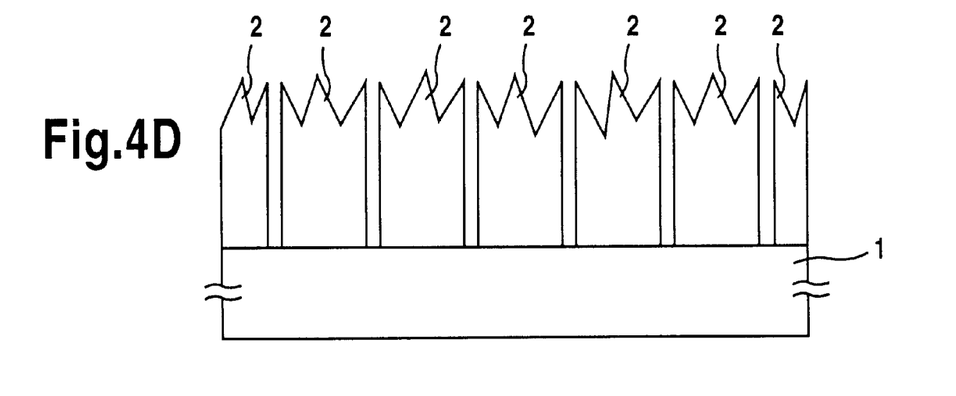

Then, as shown in FIG. 4D, the substrate 1 having the plurality of the first electrodes 2 is immersed in chlorine solution of 0.5 wt. % for about 30 minutes, is etched, and is cleaned with pure water. By this etching, a texture plane is formed on the surface of the first electrode 2.

And, as shown in the above mentioned FIGS. 2A–2E, a p-type amorphous silicon carbide layer of approximately 100 Å, an intrinsic amorphous silicon layer of approximately 1500 Å, a n-type microcrystalline silicon layer of approximately 200 Å, a p-type amorphous silicone layer of approximately 100 Å, an intrinsic amorphous silicon germanium layer of approximately 1000 Å, and a n-type amorphous silicon layer of approximately 200 Å are laminated in this order by plasma CVD so as to form an amorphous semiconductor film 31. Formation conditions of each of the layers are shown in Table 2. In this case, reaction pressure is controlled to be 50 Pa.

TABLE 2

| | Reaction gas | Substrate temperature (° C.) | RF power (W) |
|---|---|---|---|
| First p-layer | $SiH_4$: 10 SCCM<br>$CH_4$: 5 SCCM<br>100 ppm $B_2H_6$: 5 SCCM<br>$H_2$: 150 SCCM | 150 | 200 |
| First i-layer | $SiH_4$: 50 SCCM<br>$H_2$: 100 SCCM | 200 | 200 |
| First n-layer | $SiH_4$: 10 SCCM<br>1% $PH_3$: 5 SCCM<br>$H_2$: 100 SCCM | 200 | 500 |
| Second p-layer | $SiH_4$: 10 SCCM<br>$CH_4$: 5 SCCM<br>100 ppm $B_2H_6$: 5 SCCM<br>$H_2$: 150 SCCM | 150 | 200 |
| Second i-layer | $SiH_4$: 50 SCCM<br>$GeH_4$: 10 SCCM<br>$H_2$: 100 SCCM | 200 | 200 |
| Second n-layer | $SiH_4$: 10 SCCM<br>1% $PH_3$: 5 SCCM<br>$H_2$: 100 SCCM | 200 | 200 |

A predetermined part of the amorphous semiconductor film 31 is eliminated by irradiation of YAG laser beams of wavelength 1.06 μm, pulse frequency 3 kHz, and intensity $1.3 \times 10^8$ W/cm$^2$, and is divided into a plurality of photovoltaic conversion layers 3.

Then, a metal film 41 of silver of approximately 1 μm is formed on the substrate 1 by sputtering so as to cover the photovoltaic conversion layers 3, and a predetermined part of the metal film 41 is eliminated by irradiation of Ar laser beams of wavelength 0.51 μm and intensity $2 \times 10^3$ W/cm$^2$, and is divided into a plurality of second electrodes 4 to produce a photovoltaic device of this embodiment.

A photovoltaic device for comparison is manufactured by the same method as in the case of the first embodiment except for the etching process after division for forming the first electrodes 2.

Table 3 shows measurement of a resistance value between the adjacent first electrodes 2 of the photovoltaic device of the embodiment and of the photovoltaic device of the comparison example. Table 4 shows measurement of the photovoltaic characteristics when light of AM1.5, 100 mW/cm$^2$ is irradiated to the photovoltaic devices of the embodiment and the comparison example.

TABLE 3

| | Insulation resistance (M Ω) |
|---|---|
| Embodiment | ∞ |
| Comparison example | 600 Ω |

TABLE 4

| | Voc/stage (V) | Isc (mA/cm$^2$) | F. F. | Efficiency (%) |
|---|---|---|---|---|
| First embodiment | 1.5 | 8.5 | 0.71 | 9.1 |
| Comparison example | 1.5 | 8.5 | 0.67 | 8.5 |

As shown in Table 3, the insulation resistance of the adjacent first electrodes 2 of the first embodiment improves.

In connection with this, as shown in Table 4, F.F. of the embodiment improves and high photovoltaic efficiency is obtained.

As described above, this invention can produce a photovoltaic device having excellent photovoltaic characteristics as compared with the conventional one even when zinc oxide is used for the first electrode.

Furthermore, the texture plane formed on the surface of the first electrode by the etching process after division for forming the first electrodes scatters incident light, leading to improved photovoltaic characteristics.

Meantime, energy is required to be applied for momentarily increasing a temperature up to a melting point of approximately 2000° C. for processing the transparent electrode by using energy beams. Therefore, when the energy beams are irradiated for dividing the transparent electrode into a plurality of regions, the energy is transmitted to glass. As a result, a temperature increases up to higher than 500° C. locally, causing fine cracks and irregular degradation of strength of the glass.

Figure 5:
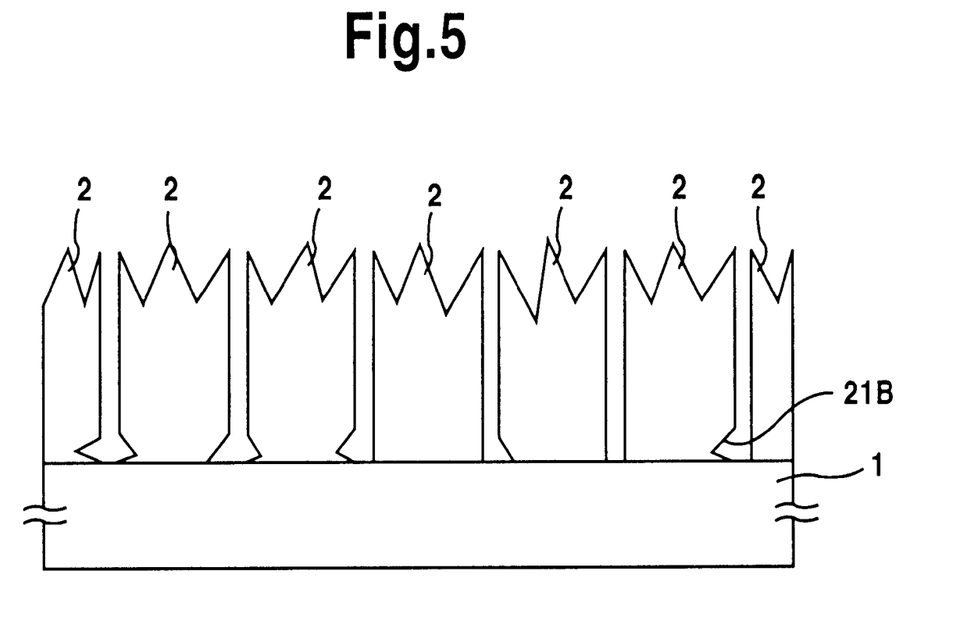
FIG. 5 is a structural cross sectional view of the photovoltaic device according to the first embodiment.

When the transparent electrode can not be electrically separated completely by scattered attachment generated in separating the transparent electrode by energy beams, a process such as etching or the like is effective for separation. At that time, as shown in FIG. 5, if a part 21B between the substrate 1 and the transparent electrode 2 which is readily etched is over-etched, the transparent electrode 2 in proximity of a part to be processed may be peeled, resulting in degraded reliability and characteristics of the device.

A second embodiment provides a method for readily using reinforced glass and preventing over-etching.

Followings are explanation on the second embodiment of this invention by referring to FIGS. 6A–6D.

Figure 6A:
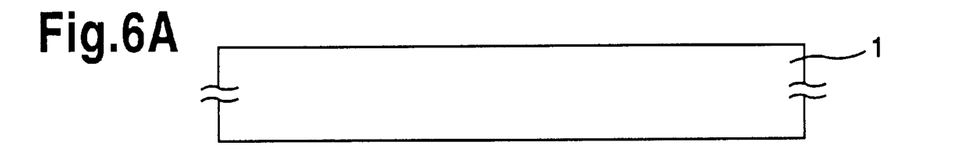
FIGS. 6A–D are structural cross sectional views of each of processes illustrating main parts of the manufacturing processes of a photovoltaic device according to a second embodiment of this invention The foregoing and other objects, features, aspects and advantages of the present invention will become more apparent from the following detailed description of the present invention when collected conjunction with the accompanying drawings.
Figure 6B:
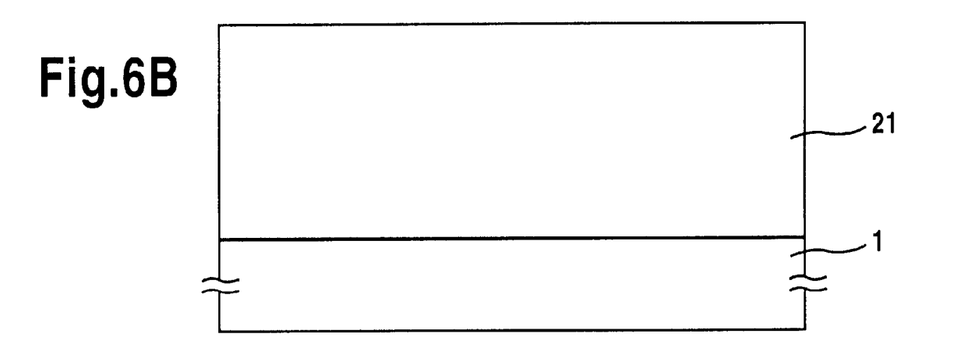

As shown in FIG. 6A, a reinforced glass substrate is used as a substrate 1. The size is 30×40 cm, 5 mm in thickness. And as shown in FIG. 6B, a zinc oxide film 21 of 8000 Å is formed on an approximately entire surface of the substrate 1 by sputtering. Conditions for forming the zinc oxide film are same as shown in Table 1.

Figure 6C:
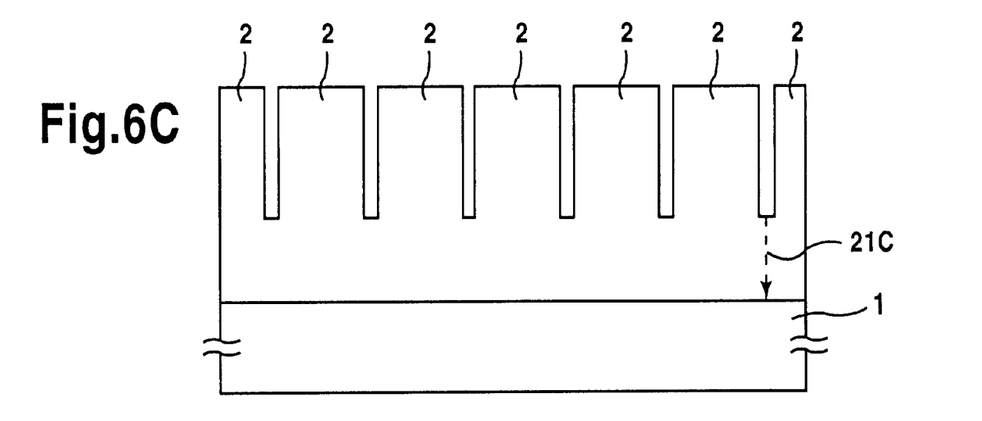

As shown in FIG. 6C, a predetermined part of the zinc oxide film 21 is processed with Nd:YAG laser of 1.06 $\mu$m wavelength, 3 kHz pulse frequency, 2.0×10$^6$ W/cm$^2$ laser power density, and 10 mm/sec. processing rate to divide into a plurality of regions so as to form a photovoltaic device of 35-stage integrated connection. The dividing process by the YAG laser intentionally leaves the zinc oxide film 21C in a divided region. In the irradiation of YAG laser under the above conditions, the zinc oxide film 21C of approximately 2000 Å is intentionally left after processing.

Figure 6D:
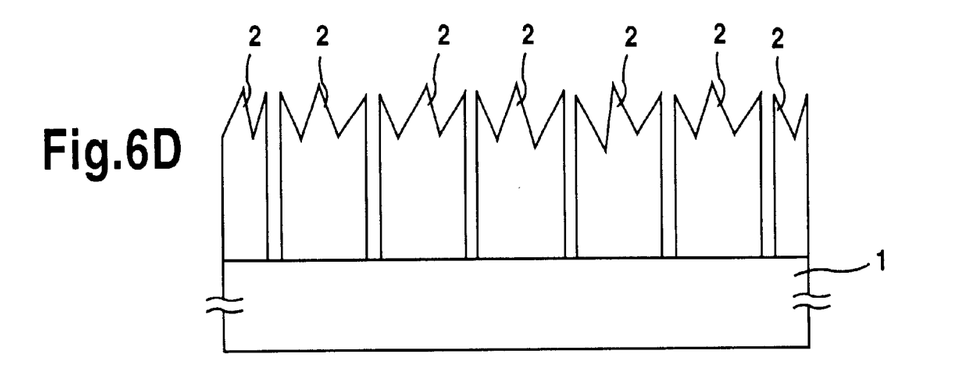

Then as shown in FIG. 6D, the substrate 1 processed with laser beams is immersed in chlorine solution of 1.0 wt. % for approximately 20 seconds and is etched to eliminate the remained zinc oxide film, and the substrate 1 is cleaned with pure water. A thickness of the zinc oxide film to be etched under the above conditions is approximately 2500 Å. The remained zinc oxide film is eliminated and a plurality of the first electrodes 2 are formed. By the etching under these conditions, a texture plane on the surface of the first electrode 2 is formed. After the etching, a cross section of the first electrode processed with energy beams is observed by a SEM with a magnification rate of 10,000. It was found from the observation that the residual of the zinc oxide film was eliminated from the processed part. Furthermore, when the resistance value between the adjacent first electrodes 2 is measured by a tester, the value was more than 1MΩ and it was found that the electrodes were electrically separated.

Then, a p-type amorphous silicon carbide layer of approximately 100 Å, an intrinsic amorphous silicon layer of approximately 1500 Å, a n-type microcrystalline silicon layer of approximately 200 Å, a p-type amorphous silicon layer of approximately 100 Å, an intrinsic amorphous silicon germanium layer of approximately 1000 Å, and a n-type amorphous silicon layer of approximately 200 Å are laminated in this order by plasma CVD on the substrate 1 so as to cover the first electrodes 2 to form an amorphous semiconductor film 31. Conditions for forming each of the layers are same as shown in Table 2.

YAG laser secondary harmonic of 0.53 $\mu$m wavelength, 3 kHz pulse frequency is irradiated to a predetermined part of the amorphous semiconductor film 31 with 2×10$^7$ W/cm$^2$ laser power density, 10 mm/sec. processing rate for obtaining good workability, to divide into a plurality of photovoltaic conversion layers 3.

A metal film 41 of aluminum of approximately 4000 Å is formed on the substrate 1 so as to cover the photovoltaic conversion layers 3 by DC sputtering. This film is formed by applying power of 0.1 kW to an Al target of 300 cm$^2$ under an atmosphere of Ar of 400 sccm, 1 Pa. YAG laser secondary harmonic of 0.53 $\mu$m wavelength, 3 kHz pulse frequency is irradiated to a predetermined part of the metal film with 2×10$^7$ W/cm$^2$ laser power density, 10 mm/sec. processing rate for obtaining good workability, to divide into a plurality of second electrodes. By these processes, the photovoltaic device of the second embodiment is produced.

For comparison, the predetermined part of the zinc oxide film 21 of approximately 8000 Å is processed with Nd:YAG laser of 1.06 $\mu$m wavelength, 3 kHz pulse frequency, 2.0× 10$^7$ W/cm$^2$ laser power density, and 10 mm/sec. processing rate to divide into a plurality of regions so as to form a photovoltaic device of 35 stage integrated connection. Then, the substrate 1 processed with laser beams is immersed in chlorine solution of 1.0 wt. % for approximately 20 seconds and is etched. The remained zinc oxide film is eliminated, and the substrate 1 is cleaned with pure water. And a photovoltaic device of the first embodiment is produced in the same way as in the second embodiment. Light of AM1.5, 100 mW/cm$^2$ is irradiated to the photovoltaic devices of the first embodiment and the second embodiment, and the photovoltaic characteristics under 25° C. are measured. The results are shown in Table 5.

TABLE 5

|  | Voc/stage(V) | Isc (mA/cm$^2$) | F. F. | Efficiency (%) |
| --- | --- | --- | --- | --- |
| First embodiment | 1.5 | 8.5 | 0.71 | 9.1 |
| Second embodiment | 1.5 | 8.5 | 0.73 | 9.1 |

As shown in Table 5, F.F in the second embodiment improves as compared with the first embodiment.

When observing a cross section of an element by a SEM, peeling of the zinc oxide film at an interface of the glass substrate and the zinc oxide film caused by over-etching is observed after the etching in the first embodiment, and degradation of F.F seems to be caused by increase of leakage component. On the other hand, over-etching is not observed in the second embodiment.

Table 6 compares an average breaking weight of a blue plate glass and a reinforced glass used in the first and second embodiments, wherein the parameter is 50.

TABLE 6

|  | 2nd embodiment (reinforced) | 1st embodiment (reinforced) | 2nd embodiment (blue plate) | 1st embodiment (blue plate) |
|---|---|---|---|---|
| Average breaking weight (kgf) | 2500 | 650 | 900 | 800 |

As indicated in Table 6, strength of the reinforced glass is maintained in the second embodiment. In the first embodiment, on the other hand, when the reinforced glass is used as a substrate, the strength is degraded as compared with the case of the blue plate glass which is not reinforced. Furthermore, it was found that the strength of the blue plate glass of the second embodiment is a little superior to that of the first embodiment.

This is because heat from irradiation energy transmits to the glass as a base in separating the transparent electrode by laser beams, and the temperature increases up to higher than 500° C. locally even when the substrate is the reinforced glass. Thus, the strength is irregularly degraded and the strength as the entire glass substrate is degraded. When observing a cross section of a glass surface of the processed part by a SEM, fine cracks are observed partially in the first embodiment. On the other hand, no crack is observed and mechanical strength is improved in the second embodiment.

Then, a thickness of the film intentionally remained on the glass substrate of the transparent electrode is changed in the process for dividing into a plurality of regions by energy beams in the second embodiment. That is, in the process for dividing into a plurality of regions by energy beams, a thickness of the film intentionally remained on the transparent electrode is changed by controlling laser power and/or processing rate. Relative comparison is made on output of a solar cell using these substrates. In Table 7, laser power is changed and processing rate is made constant at 10 mm/sec. The case of the thickness of remained film 2000 Å is used as a reference. The film is etched by chlorine of 1 wt. % for 20 seconds. The thickness of the film to be etched is 2500 Å in this case.

TABLE 7

| Power density | Thickness of remained film (Å) | Relative output after etched |
|---|---|---|
| $2 \times 10^7$ | 0 | 0.81 |
| $1 \times 10^7$ | 250 | 0.81 |
| $8 \times 10^6$ | 500 | 0.97 |
| $4 \times 10^6$ | 1000 | 1.01 |
| $2 \times 10^6$ | 2000 | 1.00 |
| $1 \times 10^6$ | 2500 | 0.87 |

As shown in Table 7, when a film is intentionally remained not more than 10% to the thickness to be etched, over-etching is not fully suppressed, resulting in degradation of output. In this experiment, when a film is intentionally remained not less than 20% to the thickness to be etched, output is improved as compared with the first embodiment and the greater output can be obtained as long as the thickness to be remained is not beyond the thickness to be etched. When the thickness of a film to be remained is not less than the thickness to be etched, any improvement was not found. Therefore, a thickness to be remained is preferably 20–80% of the thickness to be etched.

In the process for dividing into a plurality of regions by energy beams in the second embodiment, the transparent electrode of not less than a predetermined thickness is intentionally remained on a side of the glass substrate of the transparent electrode, and the adjacent divided regions are electrically separated in an etching process. These processes solve the problem of fine cracks and irregular degradation of strength, which leads to degradation of strength of the substrate, caused by heat of irradiation energy transmitted to the glass in processing the transparent electrode by energy beams.

In addition, over-etching of a part easily etched between the substrate and the transparent electrode in a case that attachment of scattered material (its thickness is less than a few dozens Å) generated in processing the transparent electrode by energy beams is prevented and reliability and characteristics of the device can be improved by preventing peeling of a transparent conductive film in proximity of the processed part.

The second embodiment is further effective in using a reinforced glass. When a temperature of the reinforced glass increases to about 500° C., nearly at a glass fusing temperature, the reinforced glass is not effective. Therefore, the insulating film and the transparent conductive film are formed under a temperature not higher than 500° C. As compared with tin oxide, relatively good light transmittivity and conductivity can be obtained at not higher than 500° C. particularly in using zinc oxide.

In this embodiment, zinc oxide formed by DC sputtering is used as the transparent electrode. This is because good film characteristics can be obtained at a relatively low substrate temperature 300° C. If sufficient conductive characteristics can be obtained at a temperature not higher than around 500° C., other material such as tin oxide and other method of formation such as MOCVD are applicable.

Although this embodiment does not form coating of insulating inorganic material on a surface of the glass substrate, the same effect can be obtained in a case of a glass substrate coated with the insulating inorganic material.

Although this embodiment describes on an example of application to the integrated solar cell device of this invention, this invention can be applied to a pin single layer solar cell device.

Although application to a photovoltaic device having component of amorphous silicon, amorphous carbonized silicon, and microcrystalline silicon is described in this embodiment, a semiconductor element of other structure using a thin film semiconductor containing other component can obtain the same effect.

This invention can be applied not only to a solar cell but to a photovoltaic device such as a photo sensor or the like.

In the above embodiment, although YAG laser beams are used as energy beams for separating the transparent electrode, line beams of excimer laser can be used for separation.

Although the present invention has been described and illustrated in detail, it is clearly understood that the same is and example only and is not to be taken by way of limitation by way of illustration, the spirit and scope of the present invention being limited only by the terms of the appended claims.

What is claimed is:

1. A manufacturing method of a photovoltaic device provided with a plurality of unit cells including a first electrode of zinc oxide, a photovoltaic conversion layer, and a second electrode on a surface of a transparent substrate, comprising a process for forming a zinc oxide film on the surface of the substrate, a process for eliminating a predetermined part of the zinc oxide film by energy beam irradiation and dividing the zinc oxide film into a plurality of the first electrodes, and a process for etching the surface of the substrate provided with a plurality of the first electrodes, so as to reduce a diffusion region and/or residual of zinc oxide.

2. The manufacturing method of a photovoltaic device according to claim 1, wherein a texture plane is formed on a surface of the first electrode by etching.

3. The manufacturing method of a photovoltaic device according to claim 1, wherein the etching is provided by wet-etching using acid or dry-etching using halogen gas.

4. The manufacturing method of a photovoltaic device according to claim 1, wherein the energy beam is a solid laser beam of YAG laser or a line beam of an excimer laser.

5. A manufacturing method of a photovoltaic device provided with a plurality of unit cells including a first electrode of zinc oxide, a photovoltaic conversion layer, and a second electrode on a surface of a transparent substrate, comprising a process for forming a zinc oxide film on the surface of the substrate, a process for eliminating a predetermined part of the zinc oxide film by energy beam irradiation so as to leave the zinc oxide film of not less than a predetermined thickness on a side of the transparent substrate and preliminarily dividing the zinc oxide film into a plurality of the first electrodes, and a process for etching the surface of the substrate provided with a plurality of the first electrodes which are preliminarily divided, so as to reduce a diffusion region and/or residual of zinc oxide, and electrically separating adjacent divided areas.

6. The manufacturing method of a photovoltaic device according to claim 5, wherein the thickness of the film remained on the side of the transparent substrate is 20–80% of a thickness of the film to be eliminated by etching.

7. The manufacturing method of a photovoltaic device according to claim 5, wherein a texture plane is formed on a surface of the first electrode by etching.

8. The manufacturing method of a photovoltaic device according to claim 5, wherein the etching is provided by wet-etching using acid or dry-etching using halogen gas.

9. The manufacturing method of a photovoltaic device according to claim 5, wherein the energy beam is a solid laser beam of YAG laser or a line beam of an excimer laser.

10. A manufacturing method of a photovoltaic device provided with a plurality of unit cells including a first electrode of zinc oxide, a photovoltaic conversion layer, and a second electrode on a surface of a transparent substrate, comprising a process for forming a zinc oxide film on the surface of the substrate, a process for eliminating a predetermined part of the zinc oxide film by energy beam irradiation and dividing the zinc oxide film into a plurality of the first electrodes, and a process for etching the surface of the substrate provided with the plurality of the first electrodes, wherein the transparent substrate is reinforced glass.

11. A manufacturing method of a photovoltaic device provided with a plurality of unit cells including a first electrode of zinc oxide, a photovoltaic conversion layer, and a second electrode on a surface of a transparent substrate, comprising a process for forming a zinc oxide film on the surface of the substrate, a process for eliminating a predetermined part of the zinc oxide film by energy beam irradiation so as to leave the zinc oxide film of not less than a predetermined thickness on a side of the transparent substrate and preliminarily dividing the zinc oxide film into a plurality of the first electrodes, and a process for etching the surface of the substrate provided with the plurality of the first electrodes which are preliminarily divided, and electrically separating adjacent divided areas, wherein the transparent substrate is a reinforced glass.

* * * * *